United States Patent [19]
Collins et al.

[11] Patent Number: 5,150,279
[45] Date of Patent: Sep. 22, 1992

[54] HIGH PERFORMANCE COMPUTER SYSTEM WITH PLATTERS AND UNIDIRECTIONAL STORAGE MODULES THEREBETWEEN

[75] Inventors: Clive A. Collins, Poughkeepsie; James A. McDonald, Newburgh, both of N.Y.

[73] Assignee: International Business Machines Corporation, Armonk, N.Y.

[21] Appl. No.: 671,057

[22] Filed: Mar. 18, 1991

[51] Int. Cl.$^5$ .......................... H05K 7/12; H05K 7/20; H02B 1/56; G11C 5/06

[52] U.S. Cl. ..................................... 361/393; 361/380; 361/385; 365/52; 365/63; 395/800; 364/927.83

[58] Field of Search .......................... 364/708, 927.83; 365/52, 63; 395/800; 361/380, 382, 383, 384, 385, 386, 387, 388, 393, 394

[56] References Cited

U.S. PATENT DOCUMENTS

| | | | |
|---|---|---|---|
| 3,434,014 | 3/1969 | Taynton | 361/384 |
| 3,633,371 | 12/1986 | Nagy | 361/385 |
| 3,833,840 | 9/1974 | Sinden | 361/394 X |
| 4,335,781 | 6/1982 | Duffy | 361/385 X |
| 4,417,295 | 11/1983 | Stuckert | 361/384 |
| 4,502,100 | 2/1985 | Greenspan | 361/384 |
| 4,574,331 | 3/1986 | Smolley | 361/393 |
| 4,590,538 | 5/1986 | Cray | 361/385 |
| 4,599,680 | 7/1986 | Gibson | 361/386 |
| 4,712,388 | 12/1987 | Sullivan | 62/51.1 |
| 4,733,293 | 3/1988 | Gabuzda | 361/383 X |
| 4,734,825 | 3/1988 | Peterson | 361/393 X |
| 4,796,224 | 1/1989 | Kawai | 365/51 |
| 4,823,233 | 4/1989 | Brown et al. | 361/383 |
| 4,833,568 | 5/1989 | Berhold | 361/383 |
| 4,868,712 | 9/1989 | Woodman | 361/388 |
| 4,872,088 | 10/1989 | Hawkins | 361/384 |
| 5,060,111 | 10/1991 | Takashima | 361/384 |
| 5,063,475 | 11/1991 | Balan | 361/384 |
| 3,5276,989 | 9/1970 | Cazner et al. | 361/384 X |

OTHER PUBLICATIONS

IBM Technical Disclosure Bulletin, Kay et al, "Central Air Cooling System," Jul., 1971, vol. 14, No. 2, p. 468.
IBM Technical Disclosure Bulletin, Flaherty et al., "Multiplayer Electronics Package," May, 1977, vol. 19, No. 12, pp. 4489–4490.
IBM Technical Disclosure Bulletin, Kasdagly et al., "Modular Processor—A Method & Apparatus for Mass Producing a Computer System," Mar., 1984, vol. 26, No. 10B, pp. 5720–5722.
IBM Technical Disclosure Bulletin, "Systems Packaging Using Large Hybrid Circuit Boards," Jun., 1986, vol. 29, No. 1, pp. 80–81.
IBM Technical Disclosure Bulletin, Bolt et al., "Forced Convection, Downward Flow Cooling System," Oct., 1988, vol. 31, No. 5, pp. 44–47.
IBM Technical Disclosure Bulletin, Balan et al., "Stacked Board Power Bus Design," Jun. 1990, vol. 33, No. 1A, pp. 366–368.

Primary Examiner—Leo P. Picard
Assistant Examiner—Michael W. Phillips
Attorney, Agent, or Firm—Robert L. Troike

[57] ABSTRACT

A high performance computer system package integrates the switches and memory in the core of the package with the processors distributed about the periphery of this core. The request and response switches and the input or output lines are on platters and storage modules are coupled between the platters.

20 Claims, 18 Drawing Sheets

HIGH PERFORMANCE COMPUTER SYSTEM WITH PLATTERS AND UNIDIRECTIONAL STORAGE MODULES THEREBETWEEN

BACKGROUND OF THE INVENTION

1. Field of the Invention

The present invention generally relates to computer packaging and, more particularly, to a high performance computer package characterized by a physical structure that matches the logical structure requirements providing multi-dimensional access to circuit components and interconnections in a dense packaging media with no cables.

2. Description of the Prior Art

Increasing demand for computer power has outstripped the capability of single processors (uniprocessors) to perform. High performance computers now require many processors operating in parallel and sharing the same main memory; i.e., so-called tightly coupled parallel processors. In addition, numerically intensive computing applications are growing, placing a requirement for data processing capability at very high speeds.

The basic organization of a tightly coupled multi-processor (MP) system comprises a plurality of processors which may be selectively connected to a plurality of independently addressable memory modules known as basic storage modules (BSMs). In a typical MP system, there may be N processors and M BSMs, where M is typically greater than N. Since all processors require equal access to the BSMs, there is some form of $N \times M$ switch, such as a cross-bar switch, which selectively connects a processor to an addressed BSM for storing and retrieval of data. The traditional manner of connecting the N processors and the M Memory Elements or BSM is by a central switch. This means that as wider data busses are required and there is a need for $(N \times Buss$ width in bits$) + (M \times Buss$ width in Bits) on the switch package.

The parameters of importance to the performance of the MP system are processor cycle time, bandwidth, electrical path length, round trip delay, and skew. The processor cycle time is minimized by placing the cycle determining path elements in the closest possible proximity to each other. The bandwidth between a processor and a BSM is maximized by using the fastest possible data rate over a large number of parallel connections between the processor and the switch and between the switch and the BSMs. The electrical path length is the length between data latching points on different, but interconnected, functional units as measured in nanoseconds (nsec.). The total round trip delay from a processor to an addressed BSM and back is known as the memory latency. This includes a number of electrical path lengths. The skew is the electrical path length differences due to variations in routing from one point to another. The area of memory is determined by the surface area required to contain the storage chips and the logic support chips.

In a known construction, referred to as "card-on-board" (COB) memory, all of the external interconnections are placed on one edge of the card. When the memory is accessed for data, a signal must travel from the input edge of the card to the far side and return back to the original edge. In so doing, it has traversed the width of the card twice, with attendant delay, and the required data appears at the same edge from which it was requested. It is evident in this conventional system, there is significant skew or difference in electrical path due to accessing different parts of the memory or different memory chips in different sections of the memory, or from different processors.

Any high performance computer package must have the capacity to provide the necessary functions, support the cycle time, and minimize the latencies between functions. As cycle times have been reduced below ten nsec., the classical method of using cables to communicate between packaged function has added dramatically to the storage latency. In addition, distances between functions have been such as to require that the communicating transmission lines store signals because their length produces a delay in excess of the cycle time. This not only degrades performance, it also forces wiring restrictions to prevent reflections from being coincident with the signal information content. Concurrent with faster cycle times is the need to support more bandwidth. A portion of this bandwidth can be derived from the faster cycle time and the remainder, from wider data busses. The effect of this is to require more logic and cables which have a tendency to move functions further apart, while at the same time the performance requires functions to be closer together. In addition, cables affect connector density spacing. High performance computers, such as supercomputers, accentuate all these effects in order to support parallel operations and to satisfy the demand for faster computing power along with the insatiable demand for data. This leads to cycle times quickly approaching one nanosecond and data bandwidths exceeding 100 giga bytes (GB) per second to support many processors operating simultaneously.

SUMMARY OF THE INVENTION

It is therefore an object of the present invention to provide a computer package which minimizes the distance between functions, maintains all signal communication within the substrates that contain the logic and memory, and has a size that not only supports the required functions but also maintains a small profile in support of extremely fast cycle times.

The subject invention is based on the following principles. First, the natural information flow in the switches and memory is "through" the structure, meaning in one side and out the other. Second, the natural information flow in processors is into and out of the same function (bus control element, registers, cache, etc.) with data flowing from and returning to this function as operations are initiated and completed. Thus, a "single ended" profile from a functional connectivity point of view is provided. Third, large storage bandwidth requires not only many paths to memory but also requires a large interconnecting switch and a highly interleaved memory so that each machine cycle data can be returned to each processor on each data bus. Fourth, cables or package paths which provide no computing function and add latency are eliminated or reduced. Fifth, a small tightly-coupled package facilitates as fast a cycle time as possible and minimizes the possibility of storing signals on interconnecting wiring.

Given the above mentioned principles, the invention provides a structure wherein the memory is at the center of the package, the data and address switches are physically interleaved with the memory structure, and processors and controllers are attached through direct connection, without cables, to the peripheral edges of the memory switch structure. Cooling is provided by means of the flow of air or a liquid.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
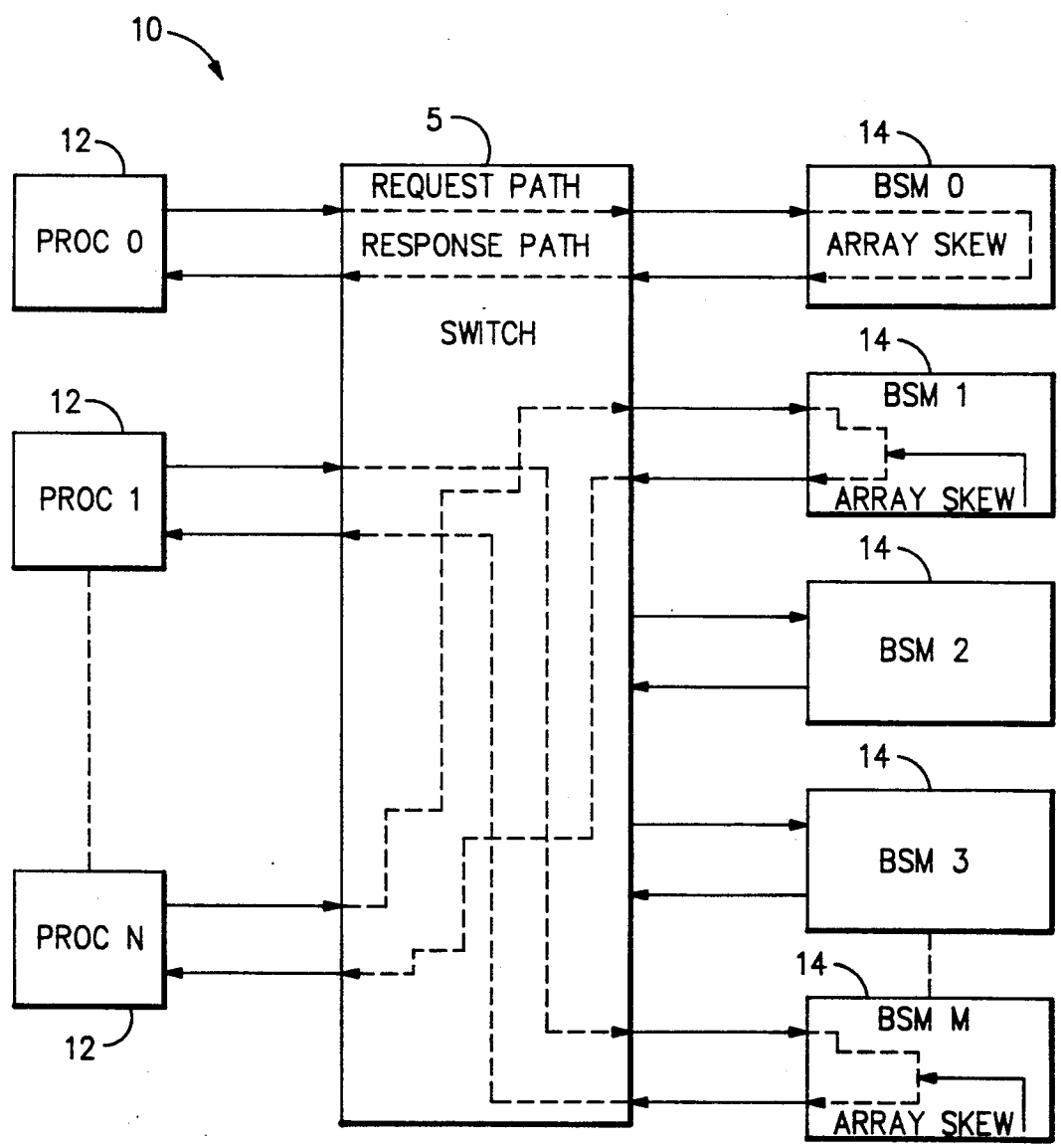
FIG. 1 is a generalized block diagram of a high performance computer system.

Referring now to the drawings, and more particularly to FIG. 1, there is shown a block diagram of a high performance computer system 10 of the type in which the subject invention is implemented (e.g., supercomputer, minisupercomputer, commercial machine mainframe, server, or the like). The system comprises a plurality of processors 12 and a plurality of BSMs 14 interconnected by a switch 5 which provides request and a respond paths between the processors 12 and BSMs 14. The switch 5 may be composed of, for example, crossbar switches of the type described in U.S. Pat. No. 4,630,045 to Christos J. Georgiou. This type of computer system is often referred to as a tightly coupled parallel multi-processor system and may be used for either commercial or scientific applications.

Figure 2:
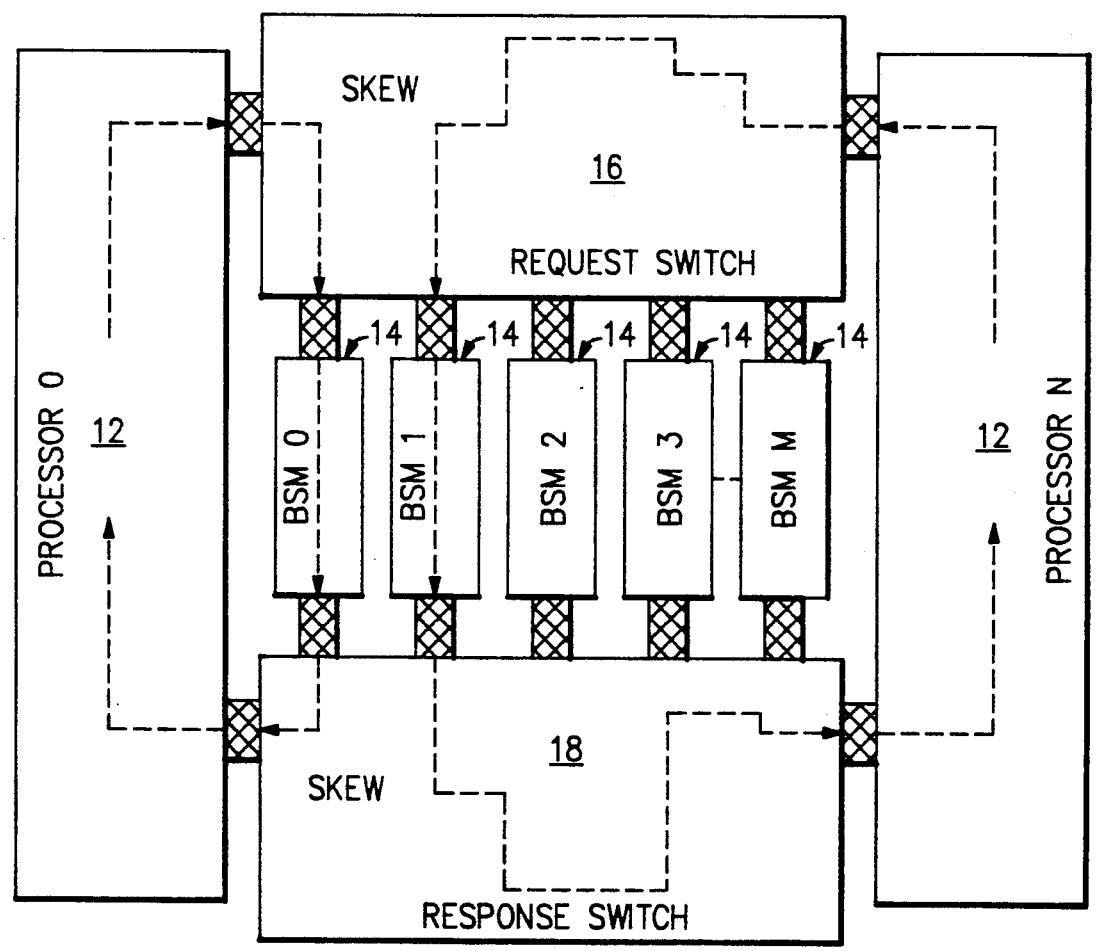
FIG. 2 is a block diagram of the high performance computer system where the functional parts of the switch have been separated and the memory has been sandwiched therebetween.

The switch 5 is often contained within a single physical package; however, as is shown in FIG. 2, in the preferred embodiment, the switch 5 is advantageously separated into a request switch 16 and a respond switch 18 to provide a package where the physical flow follows the system flow. In FIG. 2, the switches 16 and 18 and the BSMs 14 form a sandwich. The logical and physical flow are such that a processor 12 addresses a particular BSM 14 via request switch 16, and the addressed BSM 14 conveys data back to the processor 12 by response switch 18.

Any number of the processors 12 have equal access to the plurality of BSMs 14 comprising the main memory of the system. The number of BSMs is related to the number and organization of the processors in such a way as to reduce the probability of contention between processor elements for the same address space of memory to an acceptable level of performance. Since each processor 12 requires access to each BSM 14, the switches 16 and 18 between the processors and the BSMs are required, along with extensive interconnection capability, in the switch package. The request switch 16 establishes a path to the BSMs 14 to request information and to store data from the processors 12, and the switch 18 establishes a path from the BSMs 14 to fetch requested data to the processors 12.

What is desired in a high performance computer package is a uniform access to memory so that every processor has the shortest path to its active memory address space. In addition to supporting high performance potential, the tightly coupled system should provide for sharing of data and the switch memory package should provide access to all memory units. This can be provided by a centrally located main store. The machine flow, i.e., physical flow, should follow the logical flow required by the system performance and should be in as tight a form factor as possible to accommodate the cycle time and small latencies required. A sphere with the memory at its center or core would provide such a form factor. In such a system, all the communication would radiate to and from the core. The radius would be dependent on the physical limits of the technology. A sphere, however, presents many repair, service and test problems. The subject invention avoids these problems while approximating this ideal form.

Figure 3:
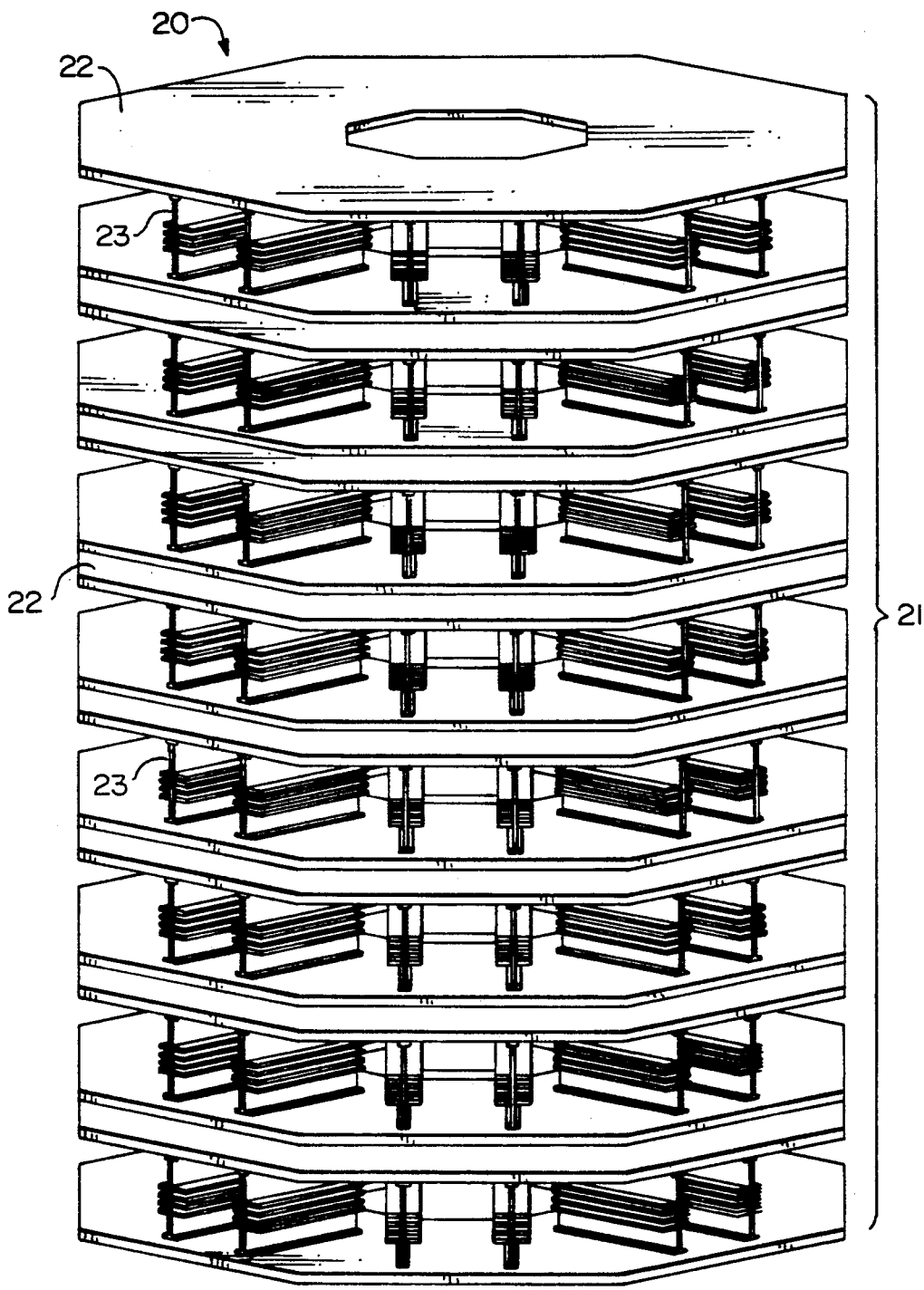
FIG. 3 is an isometric view of the memory and switch core of a polygonal configuration of a high performance computer package according to a preferred embodiment of the invention.

FIG. 3 shows the central core of the package which approximates a cylindrical shape placing the processors, switch control elements and peripheral memory support around the memory. This allows a structure that flows data from the processor to the memory back to the processor through the central core. In an ideal highly parallel super computer, the processors need to have contention free access to all memory locations. The latency involved seriously affects the sustained performance of the processor. The core 20 of the package as shown in FIG. 3 consists of memory and N×M request and response data switches to allow access by any processor to any memory element. This memory and switch core structure is essentially a memory stack divided into M segments 21 defined by "platters" 22 that contain the request and response switches and data steering logic. Between each pair of platters 22 are a plurality of BSM boards 23 which are directly connected to the top and bottom platters via zero insertion force (ZIF) connectors.

Figure 4:
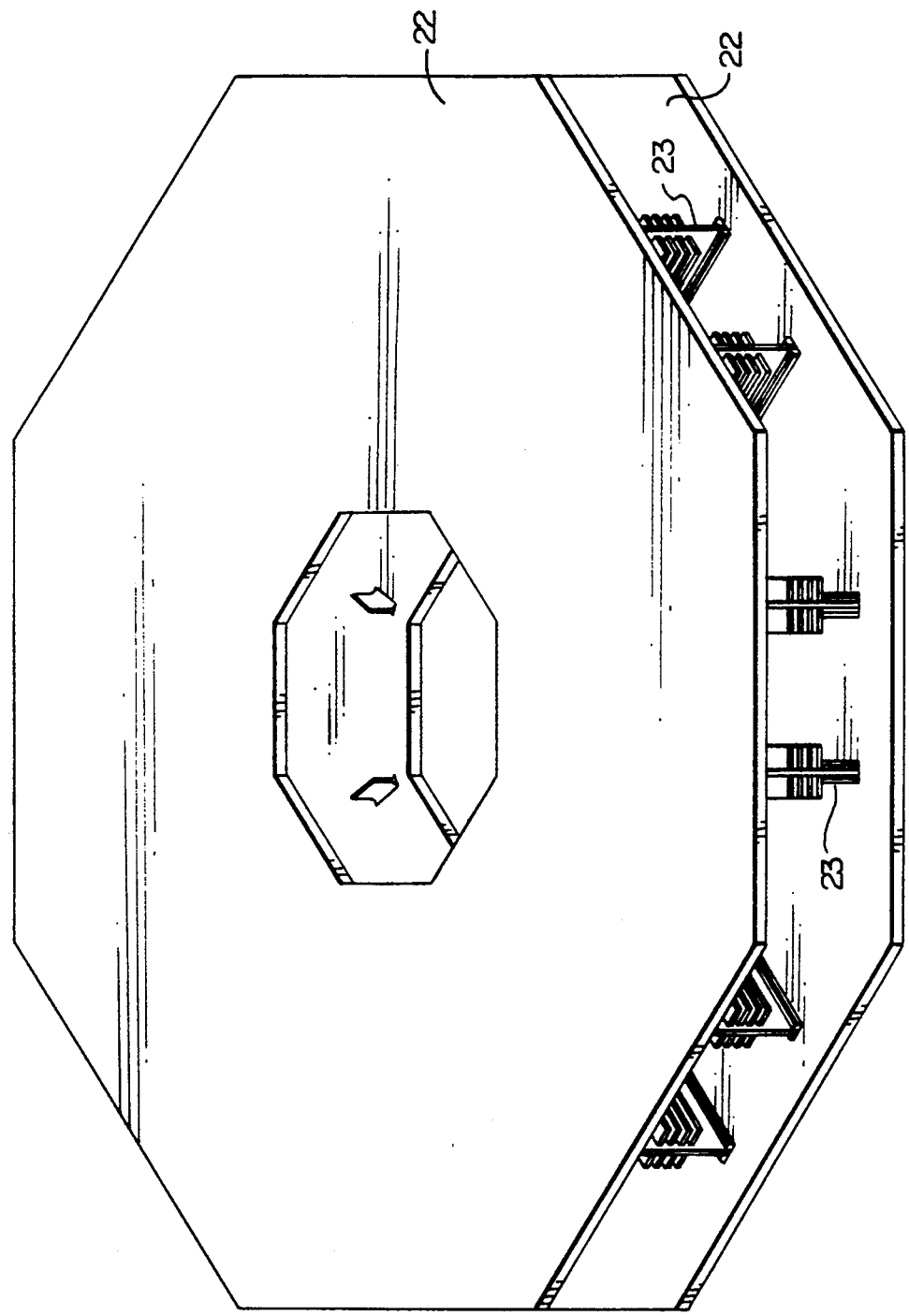
FIG. 4 is an isometric view showing a single memory and switch platter.

FIG. 4 shows a single pair of platters 22 with BSM boards 23 which has been removed from the stack. The top platter may support, for example, the request switch and, correspondingly, the bottom platter may support the response switch (16 and 18, respectively, in FIG. 2). Data access (read or write) would flow through the top platter, through the memory to the lower platter, then back to the processor. The combination of the two platters and memory elements make up a "sandwich". The memory flow is therefore designed to reduce signal delay by having the request flow in the top of the memory package and return through the bottom. The reverse flow could also be implemented.

Figure 5:
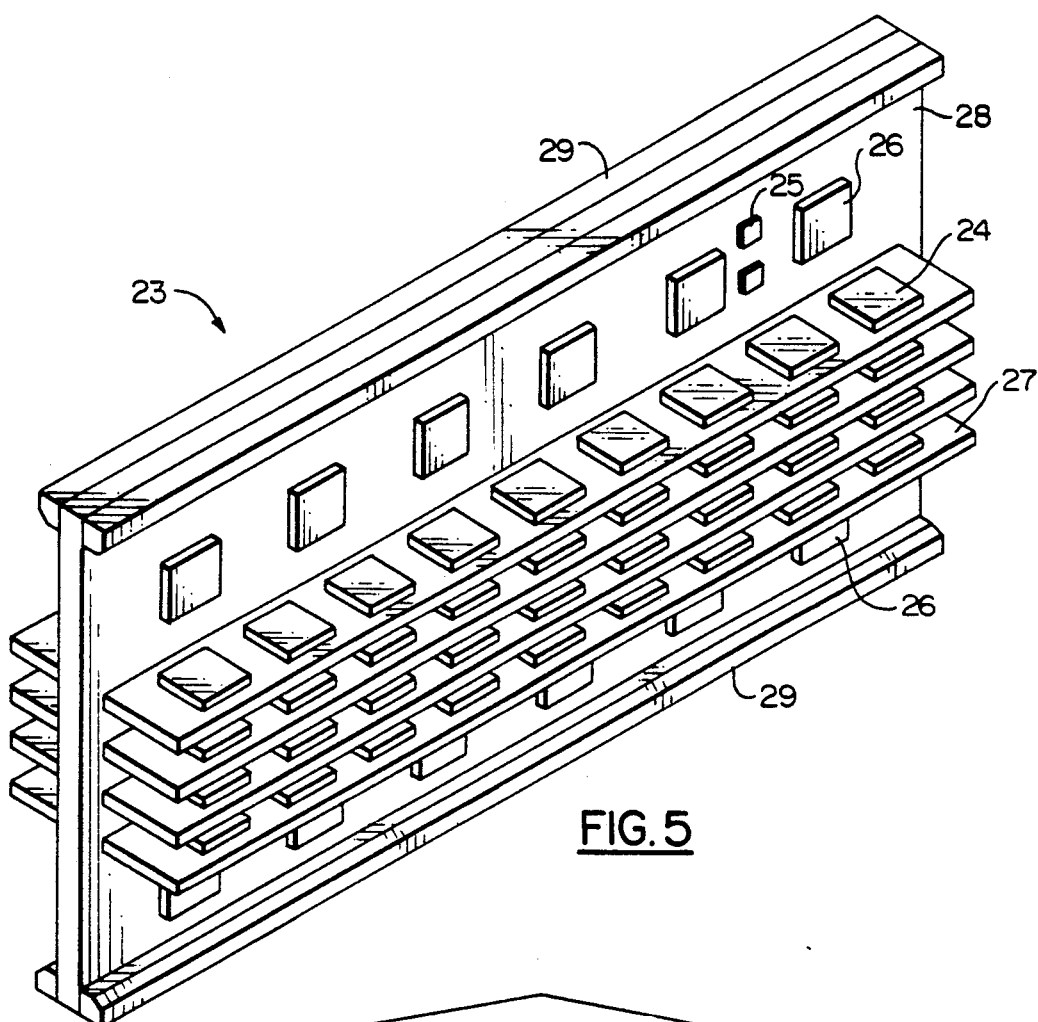
FIG. 5 is an isometric view of a BSM.
Figure 6:
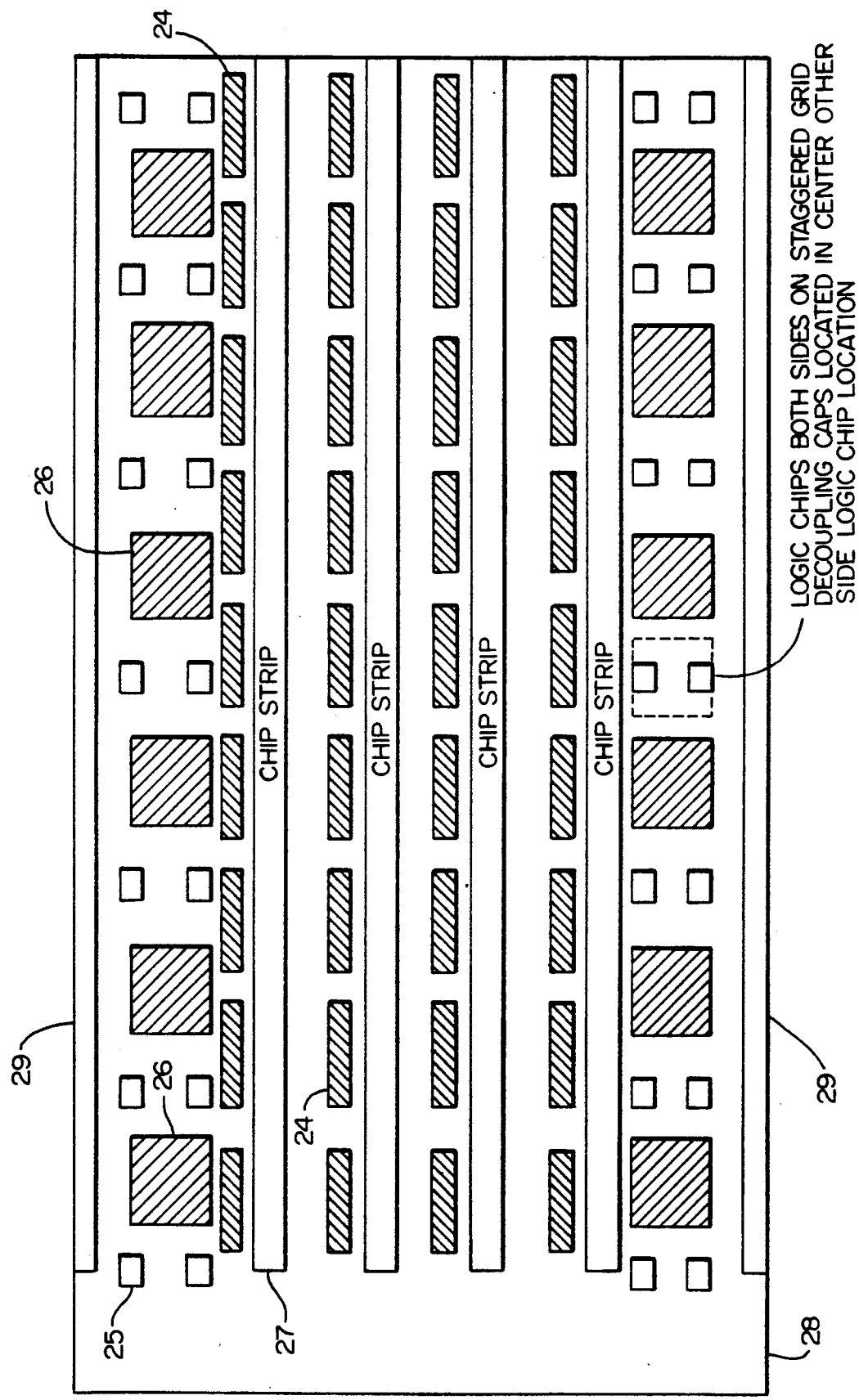
FIG. 6 is a plan view of the BSM of FIG. 5 showing in more detail the placement of logic and memory chips.
Figure 7:
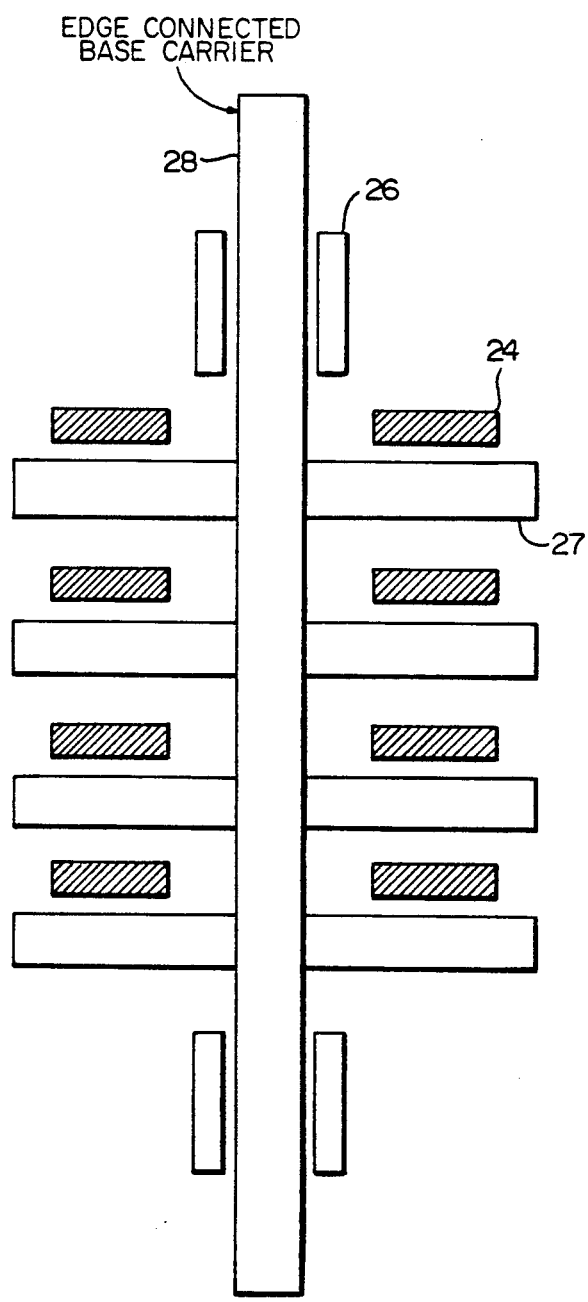
FIG. 7 is an edge view of the BSM of FIG. 5 further illustrating the placement of logic and memory chips.

The memory boards 23 are shown in more detail in FIG. 5 and contain memory chips 24, decoupling capacitors 25, memory control/data distribution logic chips 26, and input/output connectors 29 at the top and bottom of the memory board 23. The logic at the top of the memory board 23 handles the queing and processing of requests to the BSM while the logic at the bottom handles the response queing and transmission through the response switch. Depending upon the density and organization of the memory chips and the required memory size, the boards 23 may be formed by having chip strips 27 attached to the board substrate 28 to contain the necessary number of memory chips with the supporting logic chips remaining on the main substrate of the board. The ZIF connectors 29 are located along the top and bottom edges of the board substrate 28 and make the cableless connections to the top and bottom platters 22 shown in FIG. 4. The board layout is shown in greater detail in FIGS. 6 and 7, respectively, as plan and edge views of the memory board 23. FIGS. 5-7 illustrate the very high memory packing density which is possible with this invention. The memory BSM 23 shown in FIGS. 5-7 provides a small footprint, but the card 28 size could be varied, such as by making it longer which may allow for reducing the number of "sandwiches" or platter pairs. The BSM shown in FIGS. 5-7 is an example of a 32 MB (4 MB SRAMS (Static Random Access Memories)) device.

Figure 8A:
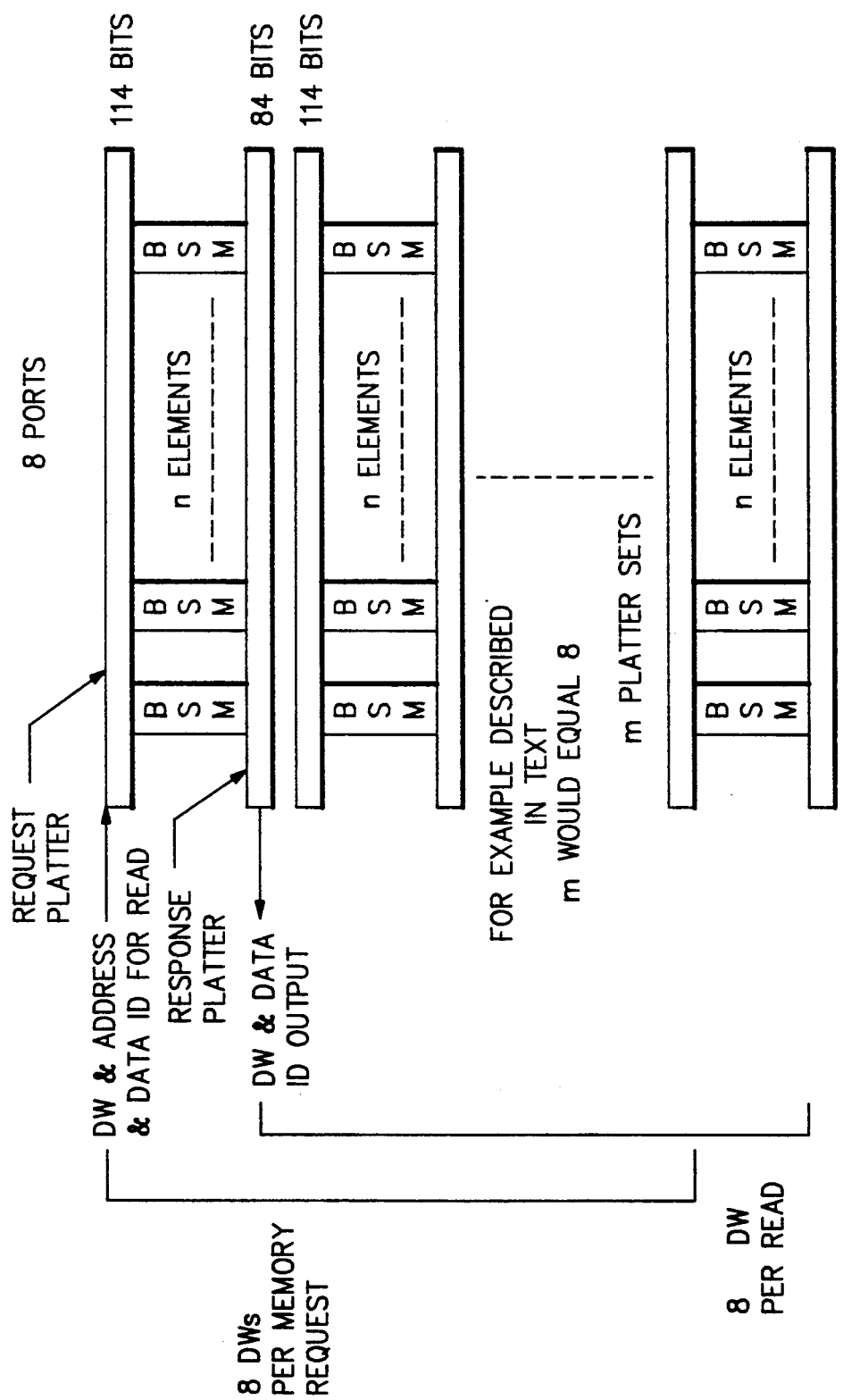
FIGS. 8a and 8b show two alternative examples of system interface structures.
Figure 8B:
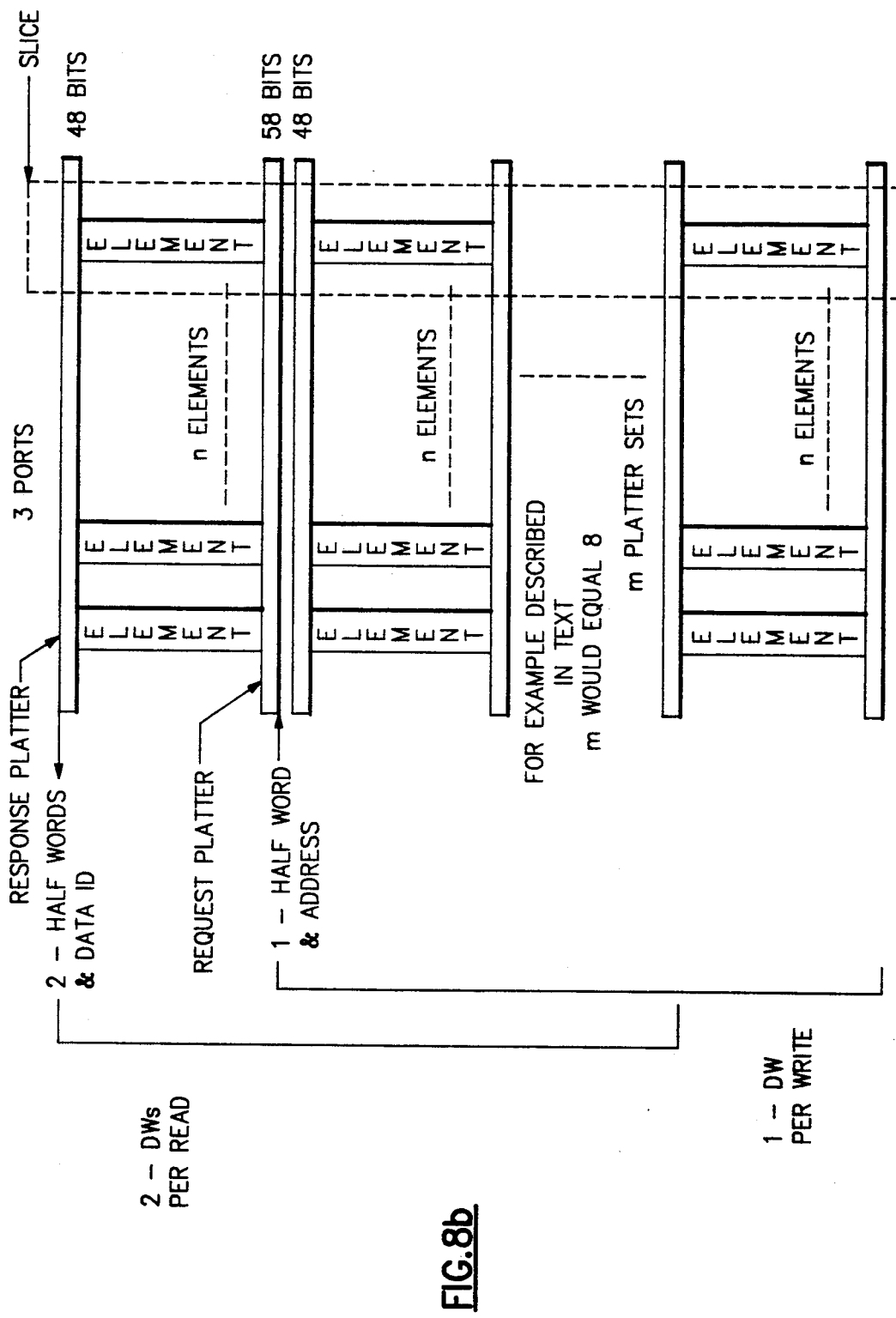

Every memory board 23 could be a BSM or an element of an BSM comprised of a "slice" through the stack as shown respectively in FIGS. 8a and 8b. The package provides a system designer near three dimensional access to memory with a variety of possible system interface structures where FIGS. 8a and 8b show only two possible examples of interface structures. In FIGS. 8a and 8b, there are 128 (8*16) servers (memory BSMs) which provides a ratio of 8 to 1 servers to requestors. FIG. 8a shows a system configuration that provides the capability of supplying a half line of data to a requestor per cycle (eight DW's where DW means double word). Hence, the structure shown in FIG. 8a would allow for any combination of reads and writes up to the eight DW interface available per processor (eight DWs is the limit of eight "sandwiches", and more "sandwiches" would make more DWs possible). FIG. 8b shows another system structure wherein the eight sandwiches are used to provide two DWs of data to a requestor and each BSM is made up of a slice of memory cards in a stack. The structure shown in FIG. 8b shows a two DW read, one DW write structure. The word width and plurality of data words should not be considered limited to the example shown in FIG. 8b since additional input/outputs per platter connection would easily expand the word width to the limit of connection technology.

Figure 9:
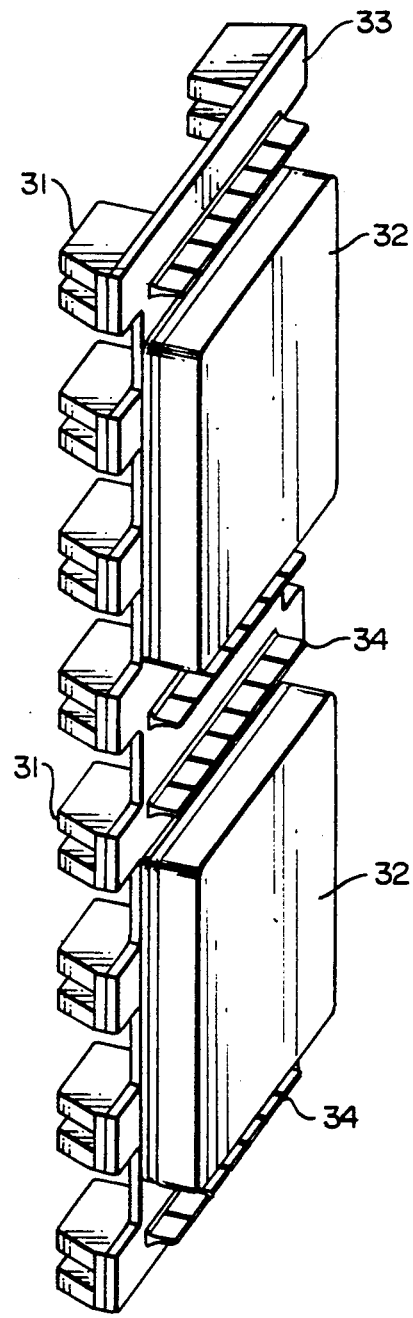
FIG. 9 is an isometric view showing a typical processor module.

An important aspect of the present invention is the use of cableless connections, such as by means of ZIF connectors or the like, which mate the platter edges with processor boards. FIG. 9 shows thermal conduction modules (TCMs) 32 which contain processor logic mounted to processor board 33. In FIG. 9, the TCMs 32 are mounted to the outer surface of the processor board 33, while various logic support chips (not shown) and ZIF connectors 31 are mounted on the inner surface. Power tabs 34 extend from the outer surface to facilitate coupling power to the package. It is envisioned that a power supply could be connected directly to the power tabs 34 for providing power to each individual module. The ability to power each processor board 33 separately from powering the central memory core is advantageous since it provides high availability and for concurrent maintenance of the processor.

Figure 10A:
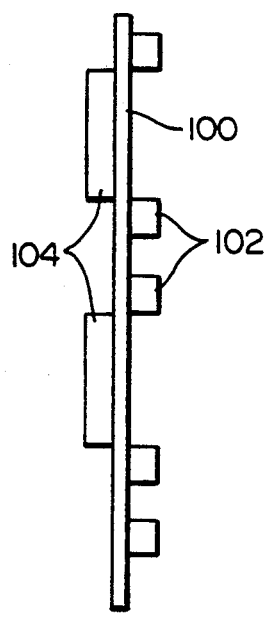
FIGS. 10a-c are side and plan views of opposite sides of a signal distribution board (requestor board)
Figure 10B:
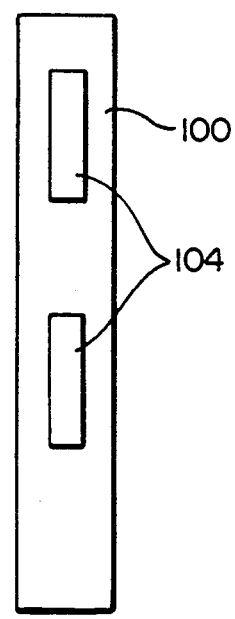
Figure 10C:
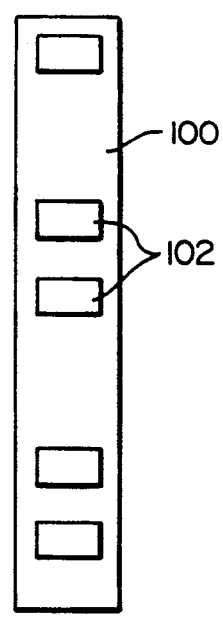
Figure 11A:
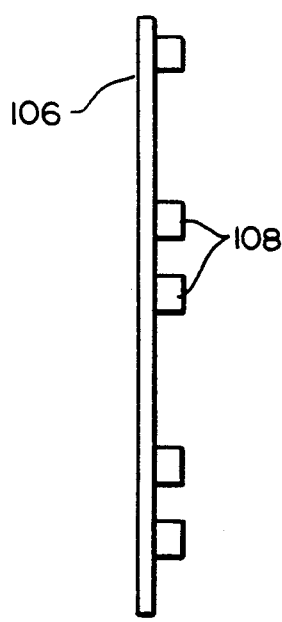
FIGS. 11a-b are side and plan views of a logic board.
Figure 11B:
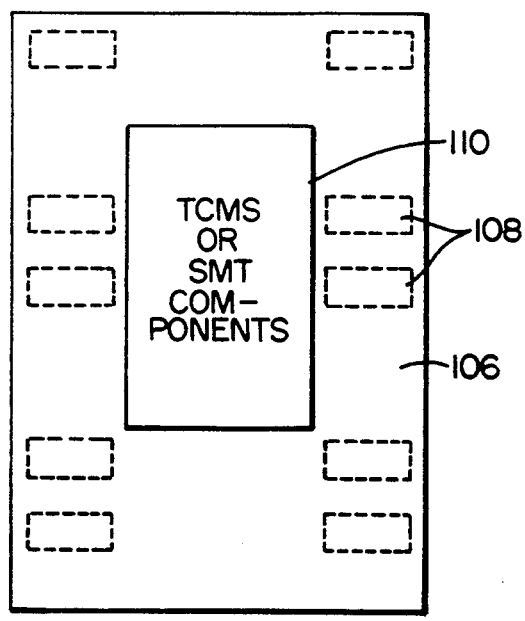

FIGS. 10a-c and 11a-b show additional processor board configurations to that shown in FIG. 9. FIGS. 10a-c show signal distribution boards 100 that include ZIF connectors 102 on their inner surfaces for connection to the platters and edge connectors 104 on their outer surfaces for connection to various processor cards (not shown). FIGS. 11a-b show a logic board 106 can be directly connected to the edges of the platters by ZIF connectors 108 on its inner surface and the external surface of the logic board 106 can include TCMs (32 as shown in FIG. 9) or Surface Mounted Technology (SMT) components 110 on its external surface. Hence, the package form factor permits a multiplicity of package technologies to be incorporated into one system based on performance needs. For example, a function contained on the processor board 33, signal distribution board 100, and logic board 106 could serve as an input-/output (I/0) processor, system-to-system data manager, off load processor, application specific processor, system memory manager, or expanded store interface.

Figure 12:
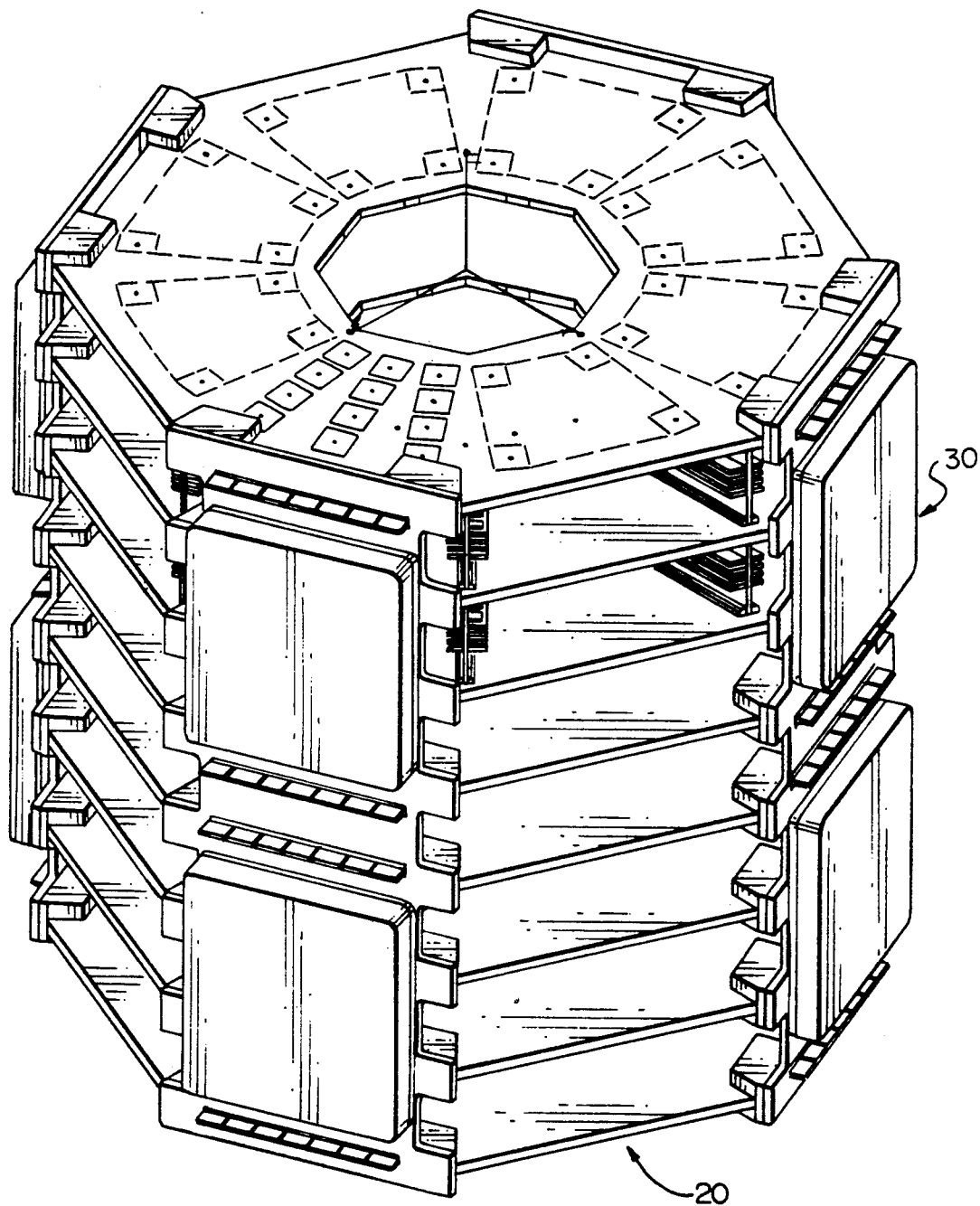
FIG. 12 is an isometric view showing processor modules attached to the periphery of the memory and switch core.
Figure 13:
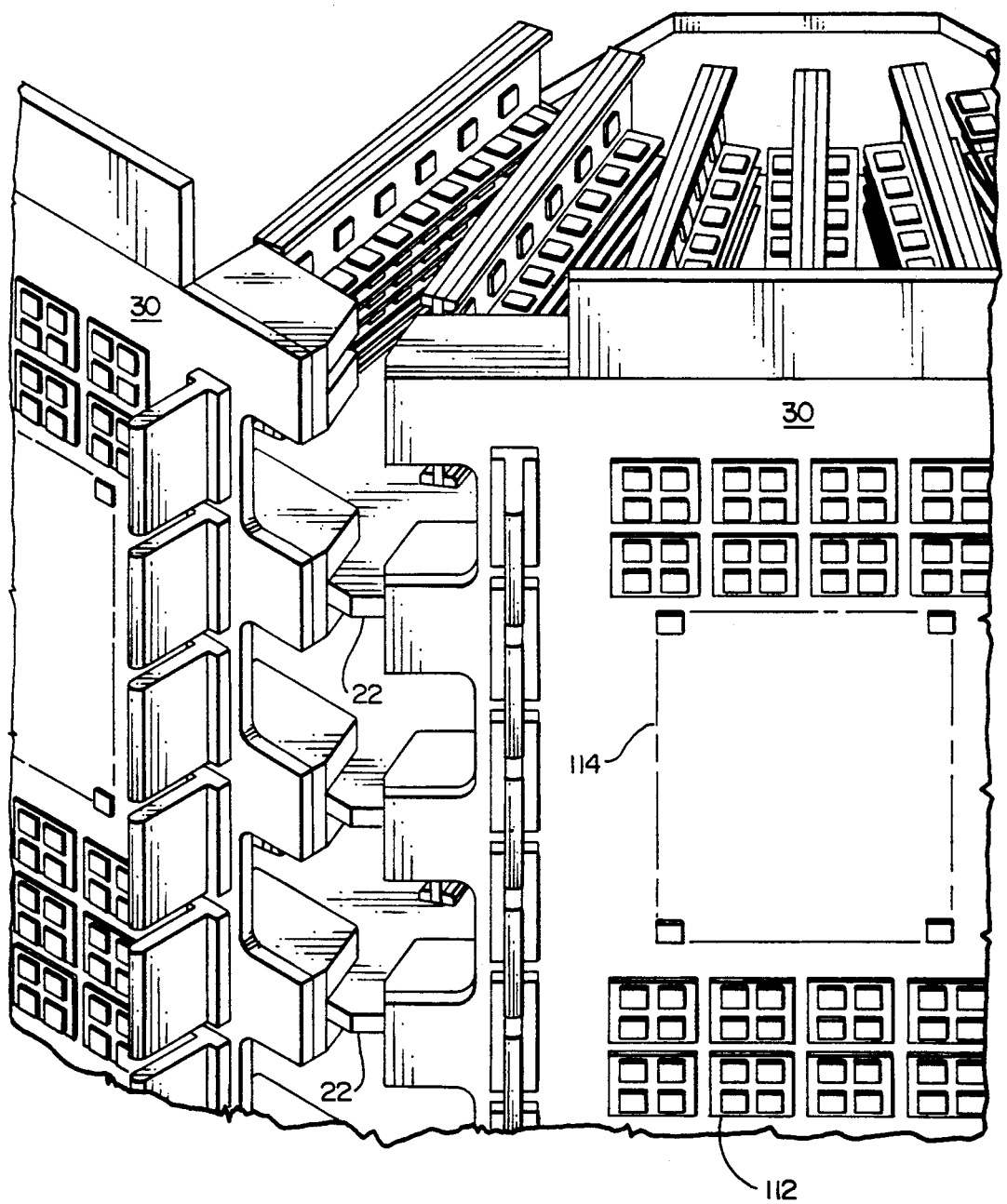
FIG. 13 is an enlarged view showing in more detail the connection of processor modules to the periphery of the memory and switch core.
Figure 14:
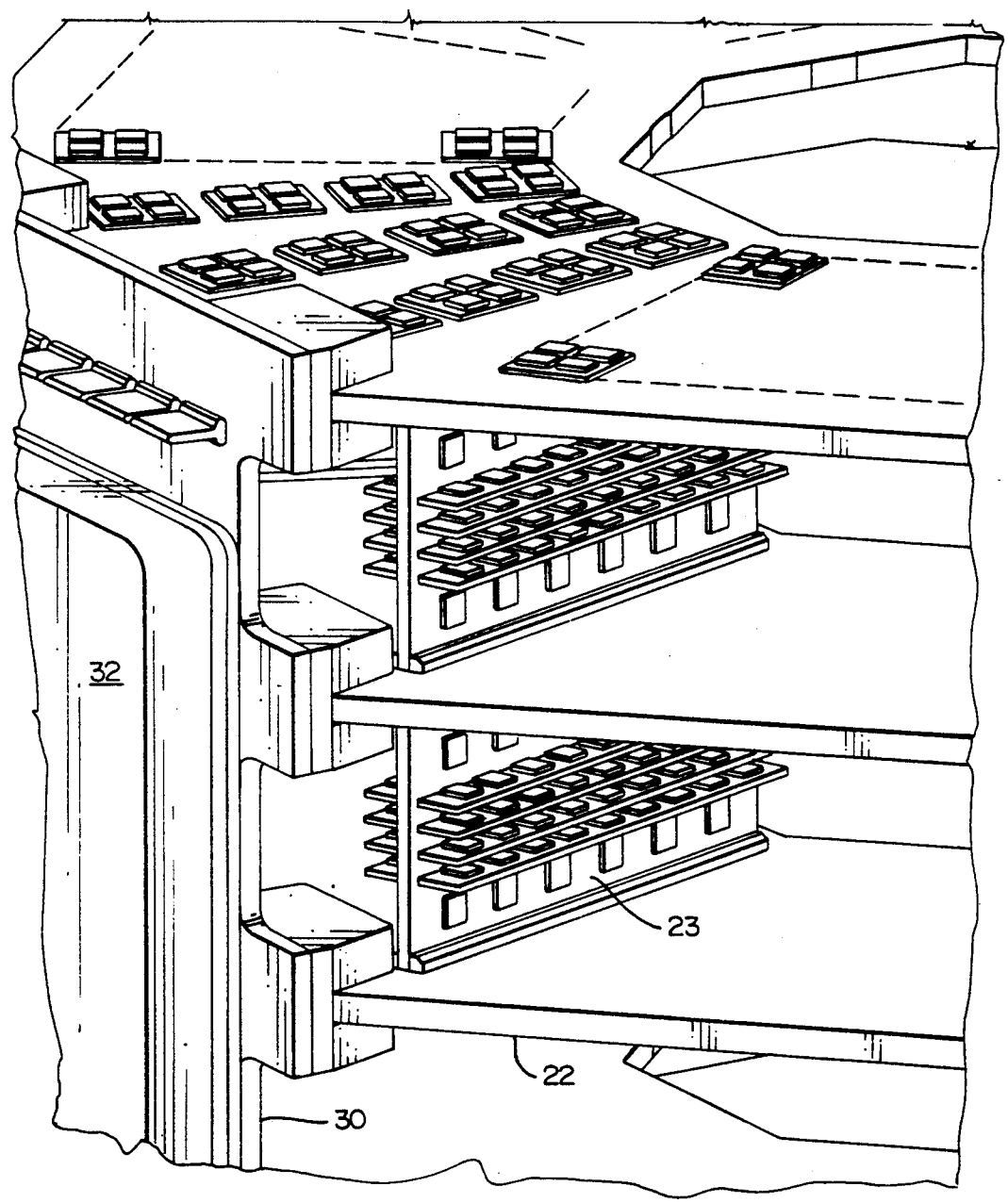
FIG. 14 is an enlarged view similar to FIG. 13 with one of the processor modules removed to reveal BSMs within the memory and switch core.

FIG. 12 shows several processor boards 30 connected to the memory and switch stack which comprises the central core 20 of the structure. Hereinafter, processor boards 30 generically refers to the processor board 33 discussed in conjunction with FIG. 9, the signal distribution board 100 discussed in conjunction with FIGS. 10a-c, and the logic board 106 discussed in conjunction with FIGS. 11a-b, and can provide a wide variety of functions based on performance needs. In the FIG. 12 view, only half the total number of processor boards 30 are shown connected to the core 20 to better illustrate the manner in which the connections are made. FIG. 13 is an enlarged view of a portion of the computer package illustrating connections of two adjacent processor boards 30 to the peripheral edges of the platters 22. The processor board 30 shown in FIG. 13 is similar to the logic board 106 shown and discussed in conjunction with FIGS. 11a-b and may include single chip and/or multichip SMT carriers 112 and an array of single chip carriers 114. FIG. 14 is an enlarged view of a portion of the computer package illustrating the connection of a processor board 30 to the peripheral edge of platters 22. The processor board 30 shown in FIG. 14 is similar to the processor board 33 shown and discussed in conjunction with FIG. 9 and may include thermal conduction module 32. The view in FIG. 14 is similar to the view in FIG. 13 except one of the processor boards 30 has been removed to reveal the memory boards 23.

Figure 15:
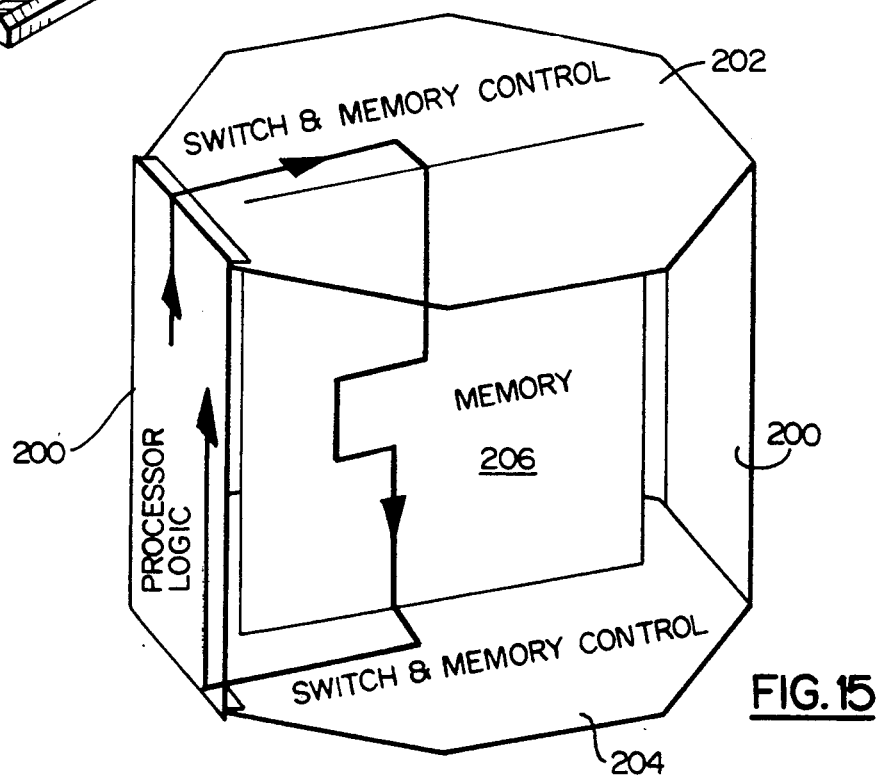
FIG. 15 is a generalized logical block diagram of the physical structure illustrating the data flow of the package.

FIG. 15 illustrates the basic concept of this invention. The processor board 200 is connected to a pair of switch and memory control boards 202 and 204, where one of the switch and memory control boards 202 makes requests of memory 206 and the other switch and memory control board 204 returns information to the processor 200. A plurality of memory boards, shown generally as memory 206, are sandwiched between the pair of switch and memory control boards 202 and 204. The memory boards are preferably positioned in a radial configuration as shown in FIG. 3. The lines and arrows demonstrate the flow of data from and to the processor. The configuration is a three dimensional, orthogonal structure which permits the surfaces and edges of appropriate boards to be joined by means of electrical connectors to accommodate the flow of information to and from the processor in the shortest possible time. While FIG. 15 shows eight sided memory switch and control boards 202 and 204 that can make connections to eight processor boards, it should be understood that additional processor boards could be added to the arrangement and that each processor board 200 could contain more than one processor where the processors would share the main memory via a simple local buss switch. The local buss switch would not be required if sufficient data bandwidth was provided by the structure. The processor boards 200 preferably allow for mounting local memories such as caches and buffer memories which would depend upon the technology components used.

In the preferred configuration, a plurality of sandwiches similar to the configurations shown in FIGS. 3 and 12 would be used and would have the tendency of reducing the number of contacts required at each physical interface between the processors 200 and the switch and memory control boards 202 and 204 and to increase the bandwidth. In addition, the switch and memory control boards 202 and 204 may include switch logic on either the top or bottoms or both of the platters. Furthermore, the request and response switches can be broken up and placed on any of the platters or processor surfaces.

Figure 16:
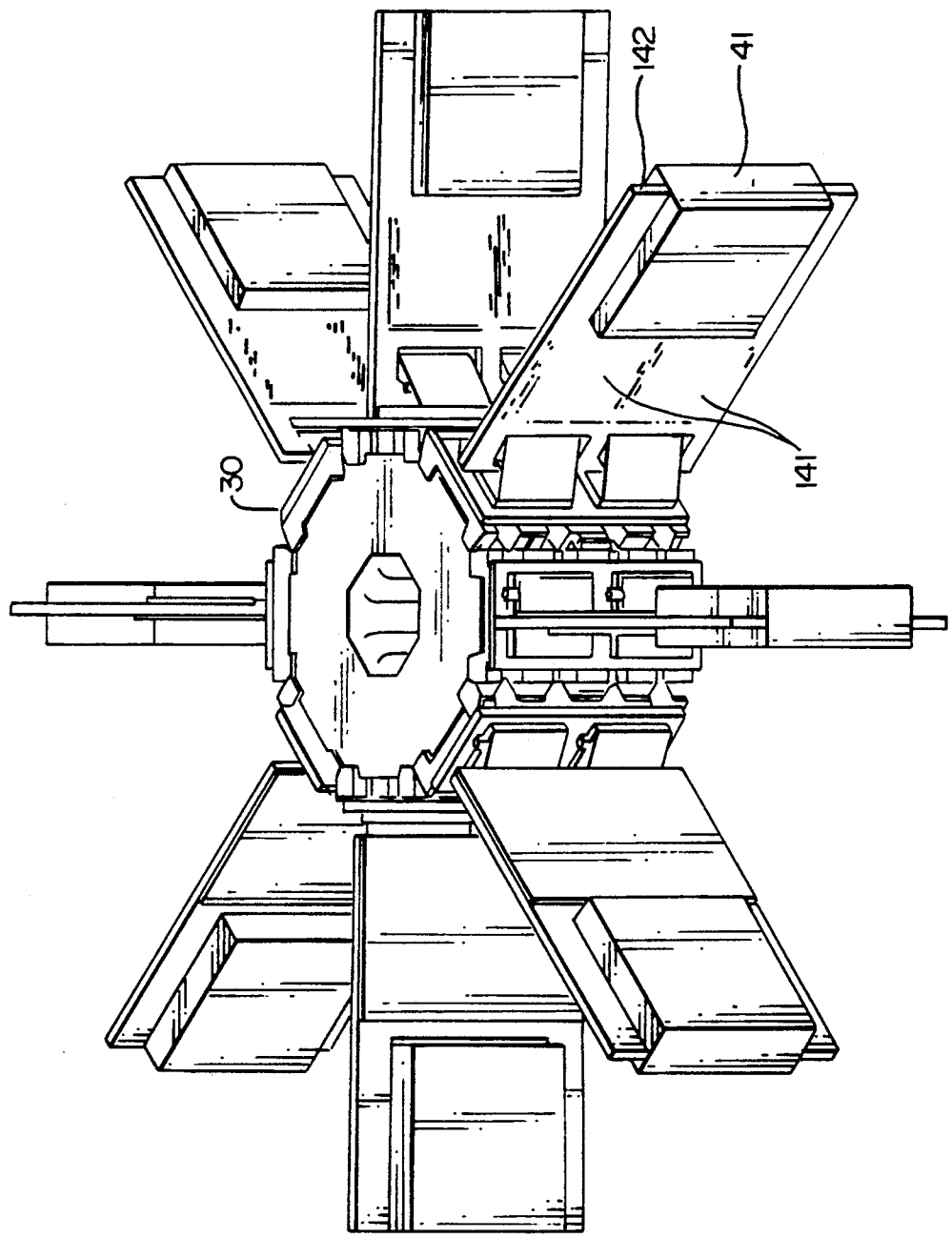
FIGS. 16 and 17 are isometric views of high performance computer structures with multiple processing boards connected to the processors.
Figure 17:
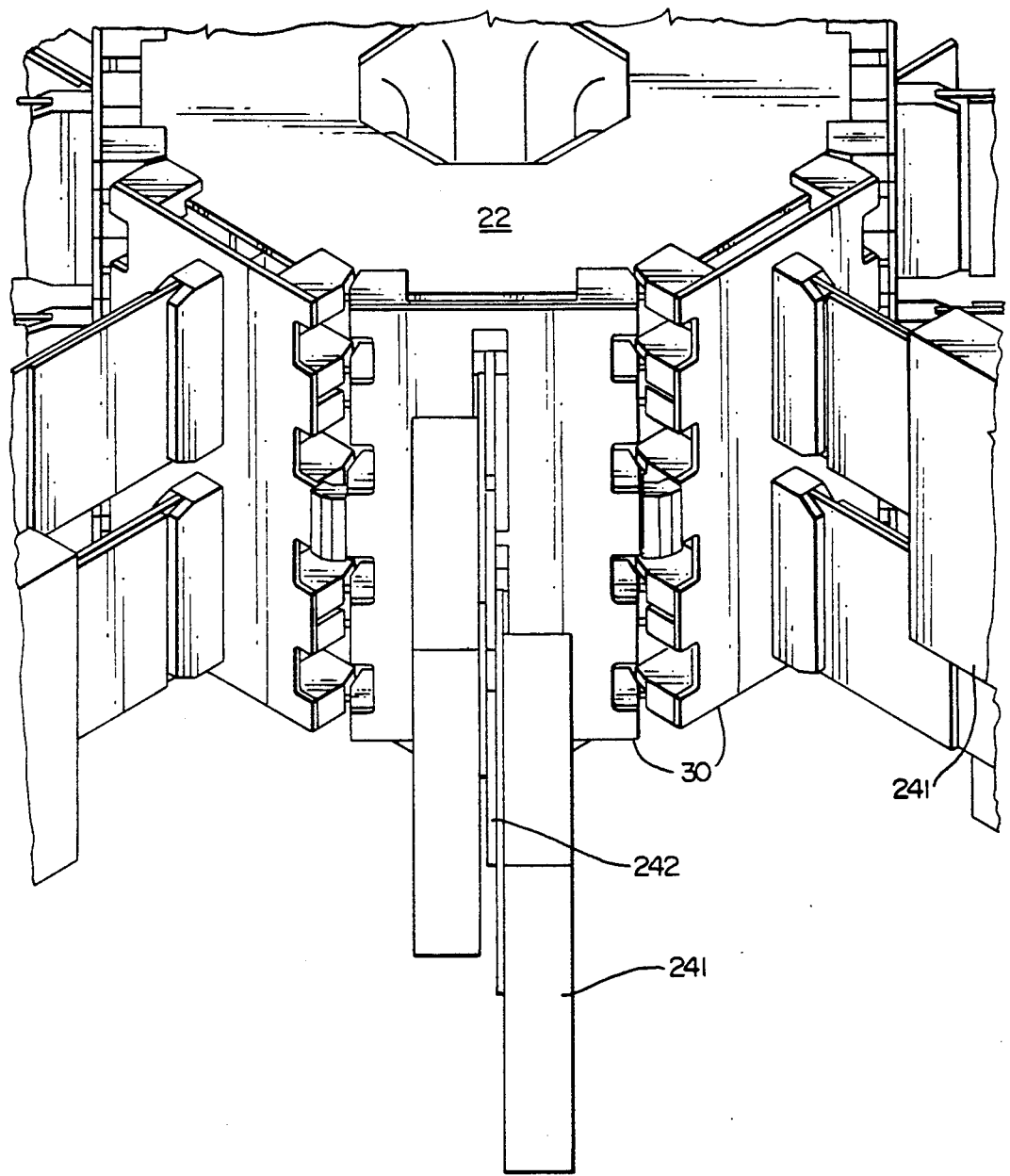

FIG. 16 shows a high performance computer structure which includes two processors shown collectively as 141 mounted in multilayer ceramic modules with an attached power supply 41 all mounted to one board 142 which is attached to each of the processor boards 30. FIG. 17 shows a high performance computer structure where components 241 are mounted on a printed circuit card 242 similar to that used for microprocessor chip sets. FIGS. 16 and 17 show just two examples of high performance computer structures within the scope of the present invention. Almost any combination of logic packaging technology can be used to meet system performance and cost requirements.

Figure 18:
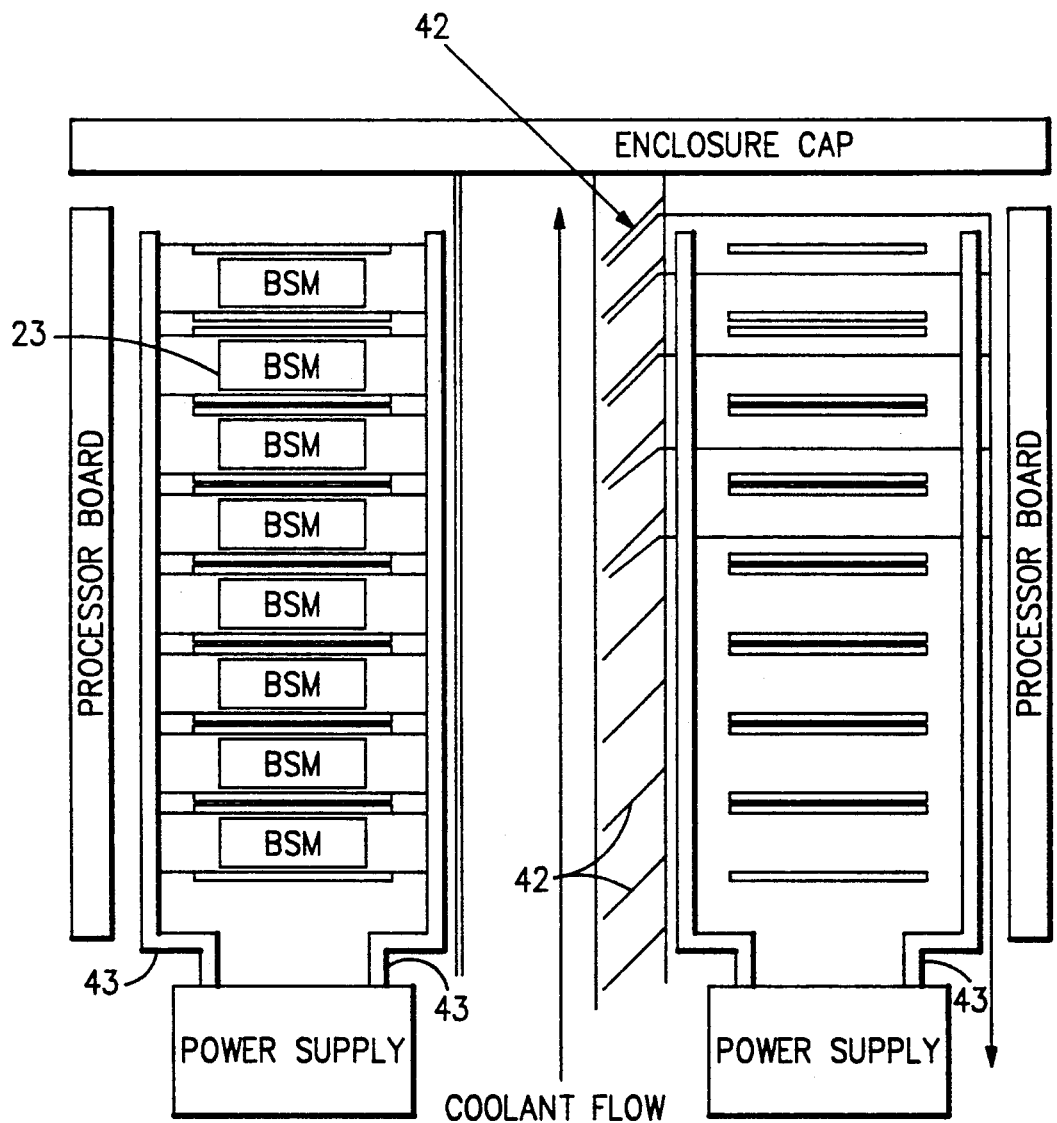
FIG. 18 is a generalized block diagram illustrating the routing of power and the flow of coolant in the computer package.
Figure 19:
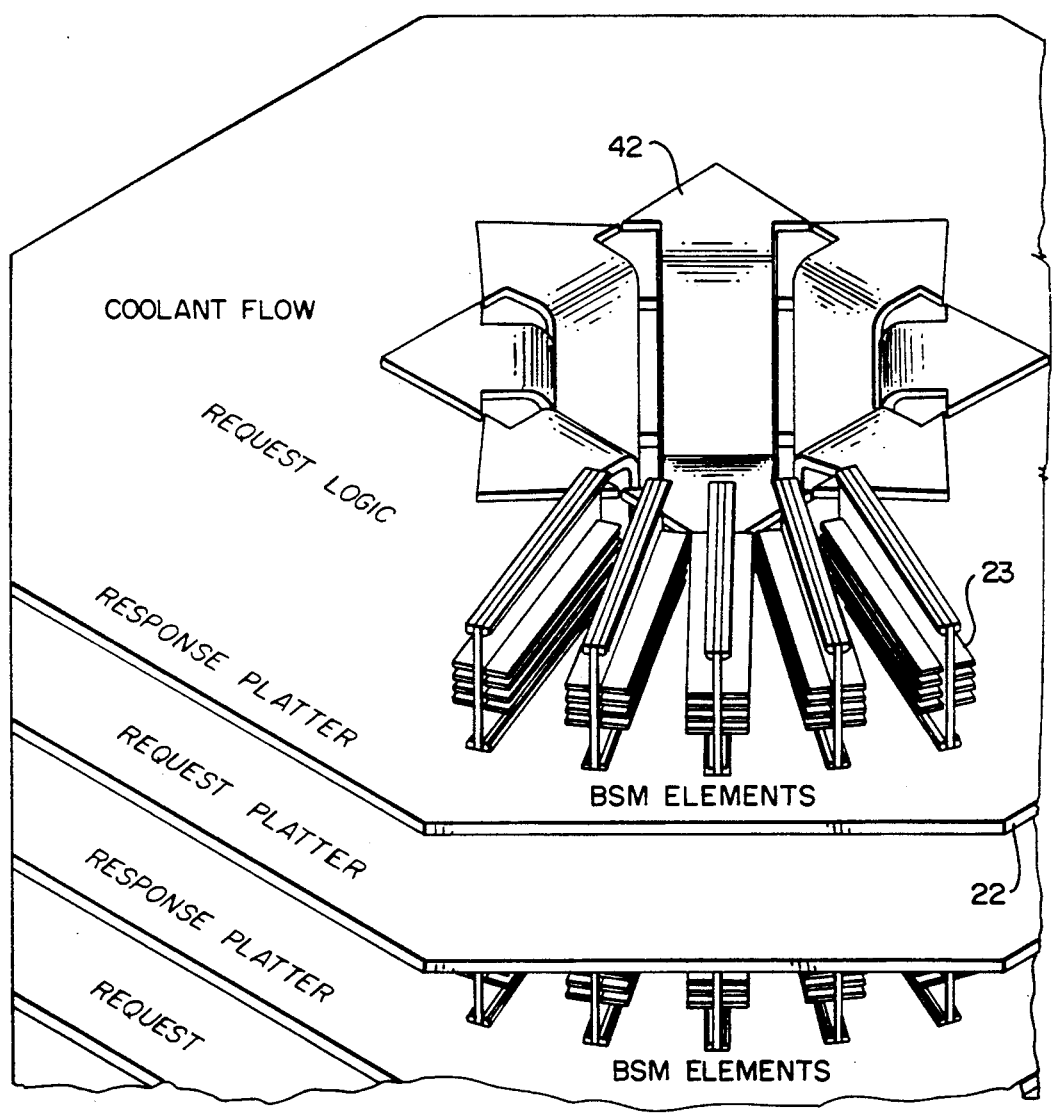
FIG. 19 is an isometric view of the cooling flow in relation to the BSMs within the memory and switch core.

Cooling of the memory and switch stack can be accomplished by using air or a liquid such as fluorocarbon circulating through the center and returned via the outside of the stack. The processors can be individually cooled by cold plates, liquid immersion, or air depending on the logic technology requirements and logic package used. FIG. 18 shows a cooling manifold 42 which fits into the hollow central part of the core 20 shown in FIG. 3. To illustrate the relationship of the manifold 42 to the memory and switch core structure, the memory boards 23 are shown in FIG. 19. Thus, it will be apparent that the manifold 42 extends along the axial length of the hollow central part of memory and switch structure with outlets at each platter or memory "sandwich" level. Return of the coolant is via the interior surface of a cooling tank which houses the computer structure. With reference back to FIG. 18, the hollow cylindrical structure of the preferred embodiment also provides a convenient way to route power busses. The power busses 43 are run up the center of the core and along a return channel for the coolant. The power busses 43 are utilized as part of the structure to mount and power the switch/memory sandwiches.

Figure 20:
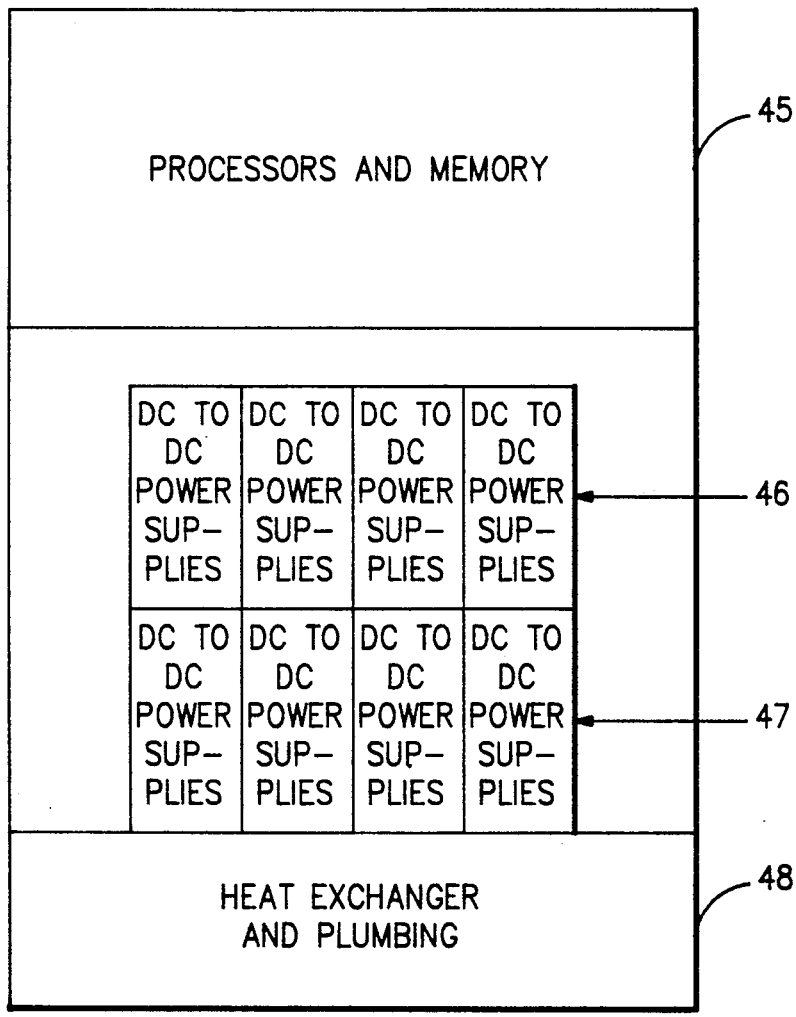
FIG. 20 is a functional block diagram showing a specific implementation of the invention.

When fully assembled, the memory and switch assembly resemble a direct access storage device (DASD) of the type that uses removable disk packs as the storage media. Each of the platter "sandwiches" which comprise the memory and switch stack resemble a disk pack and can be removed as an assembly through the top of the housing for the system structure. The platter "sandwich" structure allows rapid attachment of the complete assembly to a base which contains the power supplies, cooling reservoir and circulator for the memory and switch logic. As shown in generalized block diagram form in FIG. 20, the processors and memory can be located at the top of the complete structure, as generally denoted by the reference numeral 45. Below this are the power supplies, one bank of power supplies 46 being provided for the logic modules and another bank 47 being provided for the switch logic modules. Finally, at the bottom of the structure is a heat exchanger and plumbing 48 including pumps and controls.

The entire package occupies very little space (a small footprint). For example, the size of the package containing sixteen CPUs, each with a scalar and a vector processor, input/output (I/0) controllers, expanded store controllers, switch control elements, sixteen GBs of main memory, and three to six double word ports to memory per CPU is approximately forty-six inches in diameter and twenty-four inches high for the electronics and another thirty-six inches of height required for power supplies and coolant hardware. The essence of the invention is thus the provision of a package that allows the physical structure to match the logical structure requirements with the result that the package is capable of multi-dimensional access for meeting performance with minimal technology development and keeps the interconnections in dense packaging media with no cables.

While the invention has been described in terms of its preferred embodiments, those skilled in the art will recognize that the invention can be practiced with modification within the spirit and scope of the appended claims.

Having thus described our invention, what we claim and desire to secure by Letters Patent is as follows:

1. A high performance computer system comprising:
   a plurality of platters positioned parallel to each other, each of said platters including input or output lines and memory request or memory response switches coupled to said lines;
   unidirectional storage modules positioned between adjacent platters and electrically connected between said memory request and memory response switches on said adjacent platters and defining unidirectional memory access and response flow between said adjacent platters; and
   processors connected to peripheral edges of said platters and coupled to said input and output lines.

2. A high performance computer system as recited in claim 1 wherein said storage modules have first and second opposite edges, said first and second edges of a storage module respectively being directly mounted on a first and a second platter of said adjacent platters.

3. A high performance computer system as recited in claim 2 wherein said first and second edges of said storage module and said first and said second platters are directly mounted using zero insertion force connectors.

4. A high performance computer system as recited in claim 1 wherein said processors are connected to said peripheral edges of said platters by direct mounting using edge connectors.

5. A high performance computer system as recited in claim 4 wherein said edge connectors are zero insertion force connectors.

6. A high performance computer system as recited in claim 1 further comprising a means for controlling the temperature of said storage modules and said plurality of platters.

7. A high performance computer system as recited in claim 6 wherein said means for controlling the temperature includes a source of coolant fluid, a means to distribute coolant fluid between said adjacent platters, and a means to evacuate coolant fluid which has passed between said adjacent platters.

8. A high performance computer system as recited in claim 7 wherein said means to distribute coolant fluid includes a manifold which passes through said plurality of platters.

9. A high performance computer system as recited in claim 8 wherein said manifold passes through a centrally located opening in each of said plurality of platters.

10. A high performance computer system as recited in claim 9 wherein said storage modules are arranged to radiate outwardly from said centrally located opening in said platters towards said peripheral edges of said platters.

11. A high performance computer system as recited in claim 1 wherein each of said platters are identically sized and polygonal in shape and wherein said processors each include a processor board, each processor board having an inner surface positioned adjacent said peripheral edges of said platters.

12. A high performance computer system as recited in claim 11 wherein a processor board includes multiple processing devices connected to an outer surface or said processor board.

13. A high performance computer system as recited in claim 11 wherein a processor board includes thermal conduction modules connected to an outer surface of said processor board.

14. A high performance computer system as recited in claim 11 further comprising integrated circuit chips connected to an outer surface of a processor board.

15. A high performance computer system as recited in claim 11 further comprising signal distribution circuitry positioned on a processor board.

16. A high performance computer system as recited in claim 11 further comprising a source of power connected to an outer surface of a processor board 17. A high performance computer system as recited in claim 1 further comprising power busses for providing power to said platters, said platters being mounted on said power busses.

18. A high performance computer system as recited in claim 1 further comprising integrated circuit chips mounted on each of said platters.

19. A high performance computer system comprising:
a plurality of platters spaced parallel to each other, each of said platters including input or output lines and memory request or memory response switches coupled to said lines;
unidirectional storage modules directly mounted via mating connectors between said platters and coupled between said memory request and memory response switches defining unidirectional memory access and response flow between said platters; and
processors directly mounted via mating connectors about peripheries of said platters and coupled to said input and output lines.

20. A high performance computer system comprising:
a plurality of platters positioned parallel to each other, each of said platters including input or output lines and memory request or memory response switches coupled to said lines;
storage modules;
processors;
said storage modules and said processors connected between said platters such that said memory request and memory response switches are on opposite ends of the storage modules and the request and response flow is unidirectional through the storage modules.

* * * * *